(12) United States Patent
Kim (10) Patent No.: US 10,333,092 B2
(45) Date of Patent: Jun. 25, 2019

(54) ORGANIC LIGHT EMITTING DIODE, MANUFACTURING METHOD THEREOF, AND ORGANIC LIGHT EMITTING DIODE DISPLAY INCLUDING THE SAME

(71) Applicant: SAMSUNG DISPLAY CO., LTD., Yongin-si, Gyeonggi-do (KR)

(72) Inventor: Dong Chan Kim, Gunpo-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 205 days.

(21) Appl. No.: 15/005,526

(22) Filed: Jan. 25, 2016

(65) Prior Publication Data

US 2016/0372714 A1    Dec. 22, 2016

(30) Foreign Application Priority Data

Jun. 22, 2015 (KR) .......................... 10-2015-0088643

(51) Int. Cl.
*H01L 27/32* (2006.01)
*H01L 51/50* (2006.01)

(52) U.S. Cl.
CPC ...... *H01L 51/5088* (2013.01); *H01L 27/3262* (2013.01); *H01L 51/5092* (2013.01)

(58) Field of Classification Search
None
See application file for complete search history.

(56) References Cited

U.S. PATENT DOCUMENTS

| 4,307,163 A | * | 12/1981 | Joshi | ....................... H01M 6/18 429/199 |
| 5,677,572 A | | 10/1997 | Hung et al. | |
| 6,420,056 B1 | * | 7/2002 | Chondroudis | ......... B82Y 10/00 313/502 |
| 2003/0108770 A1 | * | 6/2003 | Hamada | .............. H01L 51/5096 428/690 |
| 2005/0264228 A1 | * | 12/2005 | Kim | ....................... G09G 3/325 315/169.3 |
| 2007/0120453 A1 | * | 5/2007 | Hwang | ............... H01L 27/3211 313/112 |

(Continued)

FOREIGN PATENT DOCUMENTS

| KR | 10-2008-0056567 A | 6/2008 |
| KR | 10-2009-0072447 A | 7/2009 |
| KR | 10-1341012 B1 | 12/2013 |

OTHER PUBLICATIONS

O. A. Jaramillo-Quintero et al., "Bright visible-infrared light emitting diodes based on hybrid halide perovskite with Spiro-OMeTAD as a hole-injecting layer", The Journal of Physical Chemistry Letters 6, p. 1883-1890. (Year: 2015).*

(Continued)

*Primary Examiner* — Eric R Smith
(74) *Attorney, Agent, or Firm* — Lewis Roca Rothgerber Christie LLP (57) ABSTRACT

An organic light emitting diode according to an example embodiment of the present disclosure includes an anode and a cathode facing each other, an emission layer between the anode and the cathode, and an auxiliary layer between the anode and the emission layer and/or between the cathode and the emission layer, wherein the auxiliary layer includes a ternary compound including a halogen element.

15 Claims, 7 Drawing Sheets

(56) References Cited

U.S. PATENT DOCUMENTS

2008/0203910 A1* 8/2008 Reynolds ............... G02F 1/155
                                                  313/506
2015/0144196 A1* 5/2015 Irwin .................. H01G 9/2027
                                                  136/261

OTHER PUBLICATIONS

M. Suta and C. Wickleder, "Photoluminescence of CsMI3:Eu2+ (M = Mg, Ca, and Sr)—a spectroscopic probe on structural distortions", Journal of Materials Chemistry C 3, p. 5233-5245 (Year: 2015).*

* cited by examiner

ORGANIC LIGHT EMITTING DIODE, MANUFACTURING METHOD THEREOF, AND ORGANIC LIGHT EMITTING DIODE DISPLAY INCLUDING THE SAME

CROSS-REFERENCE TO RELATED APPLICATION

This application claims priority to and the benefit of Korean Patent Application No. 10-2015-0088643 filed in the Korean Intellectual Property Office on Jun. 22, 2015, the entire content of which is incorporated herein by reference.

BACKGROUND

1. Field

One or more embodiments of the present disclosure relate to an organic light emitting diode, a manufacturing method thereof, and an organic light emitting diode display including the same.

2. Description of the Related Art

Recently, monitors and televisions with reduced weights and profiles have been requested, and in response to such requests, liquid crystal displays (LCDs) are being substituted for cathode ray tubes (CRTs). However, liquid crystal displays are transmissive displays requiring a separate backlight, and are limited in response speed and viewing angle.

Organic light emitting diode devices have recently received much attention as a self-emissive display devices having the advantages of a wide viewing angle, high contrast, and a fast response time.

An organic light emitting diode device emits light when electrons injected from one electrode and holes injected from another electrode are recombined in an emission layer to form excitons, and the excitons release energy.

In order to improve the efficiency of an organic light emitting diode device, it is important to improve the efficiencies of hole and electron injection from a hole-injection layer and an electron-injection layer, respectively.

The above information disclosed in this Background section is included only to enhance understanding of the background of the disclosure, and may therefore contain information that does not form the prior art that is already known in this country to a person of ordinary skill in the art.

SUMMARY

One or more aspects of embodiments of the present disclosure are directed to an organic light emitting diode and an organic light emitting diode display having a low driving voltage and improved light emitting efficiency by including a hole-injection layer containing a ternary compound including a halogen element and/or an electron-injection layer containing a ternary compound including a halogen element.

One or more aspects of embodiments of the present disclosure are directed to a method of manufacturing an organic light emitting diode having a low process cost and improved compound uniformity utilizing a process of forming the ternary compound including a halogen element. The process includes heating a source material in one crucible to form the ternary compound and then thermally evaporating the ternary compound.

An example embodiment of the present disclosure provides an organic light emitting diode including: an anode and a cathode facing each other; an emission layer between the anode and the cathode; and an auxiliary layer between at least one pair of the anode and the emission layer or the cathode and the emission layer, wherein the auxiliary layer includes a ternary compound including a halogen element.

The ternary compound may have an elemental composition represented by $A_mB_nC_z$, wherein A represents one element selected from the group consisting of a Group 1 element, a Group 2 element, a rare earth element, a transition metal, a post-transition metal, B represents one element selected from the group consisting of a Group 1 element, a Group 2 element, a rare earth element, a transition metal, and a post-transition metal, C represents a halogen element, and m, n, and z are each independently an integer from 1 to 5.

The auxiliary layer may include a hole-injection layer between the anode and the emission layer.

The auxiliary layer may include an electron-injection layer between the cathode and the emission layer.

The auxiliary layer may include a hole-injection layer between the anode and the emission layer, and an electron-injection layer between the cathode and the emission layer.

The ternary compound may have a perovskite structure.

The auxiliary layer may include a material having a dipole moment of greater than 50 debyes.

The auxiliary layer may include at least one compound selected from $RbYbI_3$, $CsYbI_3$, $KYbI_3$, $NaYbI_3$, $LiYbI_3$, $RbSmI_3$, $CsSmI_3$, $KSmI_3$, $NaSmI_3$, $LiSmI_3$, $RbMgI_3$, $CsMgI_3$, $KMgI_3$, $NaMgI_3$, and $LiMgI_3$.

An example embodiment of the present disclosure provides a method of manufacturing an organic light emitting diode, including forming an anode on a substrate; forming an emission layer on the anode; forming an electron-injection layer on the emission layer; and forming a cathode on the electron-injection layer, wherein the electron-injection layer includes a ternary compound including a halogen element, and forming the electron-injection layer includes: mixing source materials for the ternary compound in one crucible; producing the ternary compound including a halogen element by heating the crucible; and evaporating and depositing the ternary compound including a halogen element by heating the crucible.

In the mixing of the source material for the ternary compound in one crucible, the source material may include a combination of a first source material and a second source material, a combination of a first source material and another first source material, or a combination of a first source material, another first source material, and a second source material. The first source material may include at least one material selected from a Group 1 element, a Group 2 element, a rare earth element, a transition metal, a halogen element, and/or a compound thereof; and the second source material may include at least one material selected from a Group 1 element, a Group 2 element, a rare earth element, a transition metal, a post-transition metal, and/or a compound thereof.

The electron-injection layer may include at least one compound selected from $RbYbI_3$, $CsYbI_3$, $KYbI_3$, $NaYbI_3$, $LiYbI_3$, $RbSmI_3$, $CsSmI_3$, $KSmI_3$, $NaSmI_3$, $LiSmI_3$, $RbMgI_3$, $CsMgI_3$, $KMgI_3$, $NaMgI_3$, and $LiMgI_3$.

The evaporation temperature of the ternary compound may be lower than the evaporation temperatures of the first source material and the second source material.

The manufacturing method may further include forming a hole-injection layer on the anode between the steps of forming the anode on the substrate and forming the emission layer on the anode, wherein the hole-injection layer may include a ternary compound including a halogen element, and forming the hole-injection layer may include: mixing source materials for the ternary compound in one crucible;

producing the ternary compound including a halogen element by heating the crucible; and evaporating and depositing the ternary compound including a halogen element by heating the crucible.

An example embodiment of the present disclosure provides an organic light emitting diode display including a substrate; a thin film transistor disposed on the substrate; and an organic light emitting element connected to the thin film transistor, wherein the organic light emitting element includes: an anode and a cathode facing each other; an emission layer between the anode and the cathode; and an auxiliary layer between the anode and the emission layer or between the cathode and the emission layer, wherein the auxiliary layer includes a ternary compound including a halogen element.

The ternary compound may have an elemental composition represented by $A_mB_nC_z$; wherein A may represent one element selected from the group consisting of a Group 1 element, a Group 2 element, a rare earth element, a transition metal, and a post-transition metal; B may represent one element selected from the group consisting of a Group 1 element, a Group 2 element, a rare earth element, a transition metal, and a post-transition metal; C may represent a halogen element; and m, n, and z may each independently be an integer from 1 to 5.

The auxiliary layer may be a hole-injection layer between the anode and the emission layer.

The auxiliary layer may be an electron-injection layer between the cathode and the emission layer.

The auxiliary layer may be a hole-injection layer between the anode and the emission layer, and an electron-injection layer between the cathode and the emission layer.

The auxiliary layer may include a material having a dipole moment of greater than 50 debyes.

The auxiliary layer may include at least one compound selected from $RbYbI_3$, $CsYbI_3$, $KYbI_3$, $NaYbI_3$, $LiYbI_3$, $RbSmI_3$, $CsSmI_3$, $KSmI_3$, $NaSmI_3$, $LiSmI_3$, $RbMgI_3$, $CsMgI_3$, $KMgI_3$, $NaMgI_3$, and $LiMgI_3$.

As described above, an organic light emitting diode and an organic light emitting diode display according to an example embodiment of the present disclosure may have lower driving voltages and improved light emission efficiencies in the presence of at least one of a hole-injection layer and/or an electron-injection layer including a ternary compound including a halogen element.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

The present disclosure will be described more fully hereinafter with reference to the accompanying drawings, in which example embodiments of the disclosure are shown. As those skilled in the art would realize, the described embodiments may be modified in various different ways, all without departing from the spirit or scope of the present disclosure.

In the drawings, the thicknesses of layers, films, panels, regions, etc., may be exaggerated for clarity. Like reference numerals designate like elements throughout the specification, and their duplicative descriptions will not be provided. It will be understood that when an element such as a layer, film, region, or substrate is referred to as being "on" another element, it can be directly on the other element or intervening elements may also be present. In contrast, when an element is referred to as being "directly on" another element, no intervening elements are present.

An organic light emitting diode according to example embodiments of the present disclosure will now be described in more detail with reference to the drawings.

Figure 1:
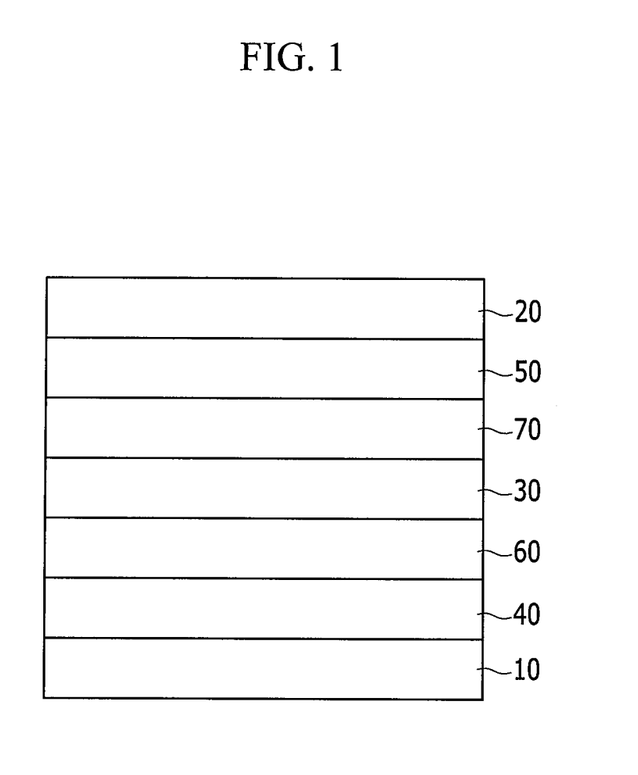
FIG. 1 is a cross-sectional view of an organic light emitting diode according to an example embodiment of the present disclosure.

FIG. 1 is a cross-sectional view of an organic light emitting diode according to an example embodiment of the present disclosure.

Referring to FIG. 1, the organic light emitting diode according to the present example embodiment includes an anode 10, a cathode 20 facing the anode 10, and an emission layer 30 between the anode 10 and the cathode 20.

The anode 10 may be a transparent electrode or an opaque electrode. In some embodiments, the transparent electrode may be formed of a conductive oxide such as indium tin oxide (ITO), indium zinc oxide (IZO), tin oxide ($SnO_2$), zinc oxide (ZnO), and/or a combination thereof, or of a metal thin film such as aluminum (Al), silver (Ag), or magnesium (Mg). In some embodiments, the opaque electrode, may be formed of a metal such as aluminum, silver, or magnesium.

For example, the anode 10 of the organic light emitting diode device according to the present example embodiment may have a cumulative (e.g., composite) structure including a reflective layer formed of silver (Ag), aluminum (Al), chromium (Cr), molybdenum (Mo), tungsten (W), titanium (Ti), gold (Au), palladium (Pd), and/or an alloy layer thereof, and an electrical reflective layer formed of a transparent electrode material such as ITO, IZO, ZnO, and/or the like.

The anode 10 may be formed by a sputtering method, a vapor phase deposition method, an ion beam deposition method, an electron beam deposition method, and/or a laser ablation method.

In one or more example embodiments, the anode 10 may have a triple-layered structure of silver (Ag)/indium tin oxide (ITO)/silver (Ag).

The cathode 20 may include a material having a low work function for readily injecting electrons. Non-limiting examples of such material may include metals such as magnesium, calcium (Ca), sodium (Na), potassium (K), titanium, indium (In), yttrium (Y), lithium (Li), gadolinium (Ga), aluminum, silver, tin, lead (Pb), cesium (Cs), barium (Ba), and alloys thereof, as well as multi-layered materials such as LiF/Al, LiO$_2$/Al, LiF/Ca, LiF/Al, and BaF$_2$/Ca. Further, the cathode 20 may be a metal electrode such as aluminum and/or the like.

For example, the cathode 20 according to the present example embodiment may be made of a conductive material including magnesium, calcium, tin, lead, titanium, yttrium, lithium, ruthenium (Ru), manganese (Mn), aluminum, lithium fluoride, or an alloy thereof, or an alloy including magnesium/silver, magnesium/indium, lithium/aluminum, and/or the like, but is not limited thereto. The alloy ratio of the metals may be controlled by proper or suitable selection of the temperature, atmosphere, and vacuum pressure of a deposition source.

The anode 10 and the cathode 20 may be formed to have two or more layers.

The emission layer 30 may include blue, red, or green light emitting materials, and may further include a host and a dopant. The materials included in the emission layer 30 are not limited. For example, the emission layer 30 may include blue emitting materials such as oxadiazole dimer dyes (e.g., bis-DAPDXP), Spiro compounds (e.g., spiro-DPVBi, spiro-6P), triarylamine compounds, bis(styryl)amine compounds (e.g., DPVBi, DSA), 4,4'-bis(9-ethyl-3-carbazovinylene)-1,1'-biphenyl (BCzVBi), perylene, 2,5,8,11-tetra-tert-butyl perylene (TPBe), 9H-carbazol-3,3'-(1,4-phenylene-di-2,1-ethene-diyl)bis[9-ethyl-9C] (BCzVB), 4,4-bis[4-(di-p-tolylamino)styryl]biphenyl (DPAVBi), 4-(di-p-tolylamino)-4'-[(d i-p-tolylamino)styryl] stilbene (DPAVB), 4,4'-bis[4-(diphenylamino)styryl]biphenyl (BDAVBi), bis(3,5-difluoro-2-(2-pyridyl)phenyl-(2-carboxypyridyl)iridium(III) (FlrPic), and/or the like; green emitting materials such as 3-(2-benzothiazolyl)-7-(diethylamino)coumarin (Coumarin 6), 2,3,6,7-tetrahydro-1,1,7,7,-tetramethyl-1H,5H,11H-10-(2-benzothiazolyl)quinolizino-[9,9a,1gh]coumarin (C545T), N,N'-dimethyl-quinacridone (DMQA), tris(2-phenylpyridine)iridium(III) (Ir(ppy)$_3$), and/or the like; and red emitting materials such as tetraphenylnaphthacene (Rubrene), tris(1-phenylisoquinoline)iridium(III) (Ir(piq)$_3$), bis(2-benzo[b]thiophen-2-yl-pyridine), (acetylacetonate) iridium(III) (Ir(btp)$_2$(acac)), tris(dibenzoylmethane) phenanthroline europium(III) (Eu(dbm)$_3$(phen)), a tris[4,4'-di-tert-butyl-(2,2')-bipyridine]ruthenium(III) complex (Ru (dtb-bpy)$_3$*2 PF$_6$), DCM1, DCM2, Eu(thenoyltrifluoroacetone)$_3$ (Eu(TTA)$_3$), butyl-6-(1,1,7,7-tetramethyljulolidyl-9-enyl)-4H-pyran: (DCJTB), and/or the like. Furthermore, a light emitting polymer material may be included. For example a polymer such as phenylene, polypphenylene vinylene), thiophene, fluorene, spiro-fluorene, and/or the like, or an aromatic compound including nitrogen and/or the like may be included, but embodiments are not limited thereto.

The emission layer 30 may be manufactured by additionally doping a light emitting dopant into an emission layer host. Non-limiting examples of fluorescent light emitting host materials may include tris(8-hydroxy-quinolinato)aluminum (Alq3), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-methylphenyl (p-DMDPVBi), ter(9,9-diarylfluorene)s (TDAFs), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAFs), 4,4'-bis(2,2-diphenyl-ethene-1-yl)-4,4'-di-(tert-butyl)phenyl (p-TDPVBi), and/or the like, and non-limiting examples of phosphorescent host materials may include 1,3-bis(carbazole-9-yl)benzene (mCP), 1,3,5-tris(carbazole-9-yl)benzene (tCP), 4,4',4"-tris(carbazole-9-yl)triphenylamine (TcTa), 4,4'-bis(carbazole-9-yl)biphenyl (CBP), 4,4'-bis(9-carbazolyl)-2,2'-dimethyl-biphenyl (CBDP), 4,4'-bis(carbazole-9-yl)-9,9-dimethyl-fluorene (DMFL-CBP), 4,4'-bis(carbazole-9-yl)-9,9-bis(9-phenyl-9H-carbazole)fluorene (FL-4CBP), 4,4'-bis(carbazole-9-yl)-9,9-di-tolyl-fluorene (DPFL-CBP), 9,9-bis(9-phenyl-9H-carbazole)fluorene (FL-2CBP), and/or the like.

According to one or more embodiments of the present disclosure, the organic light emitting diode includes an auxiliary layer between at least one selected from a pair of the anode and the emission layer, or a pair of the cathode and the emission layer. For example, the auxiliary layer may include an auxiliary layer (e.g., a hole injection layer) between the anode and the emission layer, and/or an auxiliary layer (e.g., an electron injection layer) between the cathode and the emission layer.

The content of the light emitting dopant may vary according to the material forming the emission layer, but generally, the content of the light emitting dopant may be in a range of about 3 to about 10 parts by weight based on 100 parts by weight of the material forming the emission layer (total weight of the host and the dopant).

A hole-injection layer 40 and a hole-transport layer 60 may be between the anode 10 and the emission layer 30. The hole-injection layer 40 may be on the anode 10, and the hole-transport layer 60 may be between the hole-injection layer 40 and the emission layer 30.

The hole-transport layer 60 may include a carbazole derivative such as N-phenylcarbazole, polyvinylcarbazole, and/or the like, or an amine derivative having an aromatic fused ring such as N,N'-bis (3-methylphenyl)-N,N'-diphenyl-[1,1-biphenyl]-4,4'-diamine (TPD), N,N'-di(naphthalen-1-yl)-N,N'-diphenylbenzidine (α-NPD), and/or the like.

In one or more example embodiments, the hole-injection layer 40 may include a ternary compound including a halogen element.

The hole-injection layer 40 may be formed of a ternary compound represented by $A_mB_nC_z$. Herein, A may represent one element selected from a Group 1 element and a Group 2 element of the periodic table, a rare earth element, a transition metal, and a post-transition metal, and B may represent one element selected from a Group 1 element, a Group 2 element, a rare earth element, a transition metal, and a post-transition metal. C may represent a halogen element.

In one or more example embodiments, $A_mB_nC_z$ may represent a combination of a Group 1 element for A, a lanthanide element for B, and a halogen element for C.

m, n, and z may each independently be an integer from 1 to 5. m, n, and z may each be appropriately selected according to the selection of each A, B, and C element.

In the present example embodiment, the hole-injection layer 40 may include at least one compound selected from RbYbI$_3$, CsYbI$_3$, KYbI$_3$, NaYbI$_3$, LiYbI$_3$, RbSmI$_3$, CsSmI$_3$, KSmI$_3$, NaSmI$_3$, LiSmI$_3$, RbMgI$_3$, CsMgI$_3$, KMgI$_3$, NaMgI$_3$, and LiMgI$_3$.

According to one or more example embodiments, the hole-injection layer 40 may be formed to have a ternary compound including a halogen element, and may be formed to have a ferroelectric material. In this case, the material applied to the hole-injection layer 40 may have a dipole moment of greater than 50 debyes.

According to one or more example embodiments, in the compound represented by $A_mB_nC_z$ in the hole-injection layer 40, m, n, and z may respectively be 1, 1, and 3. The compound represented by ABC$_3$ (m=1, n=1, and z=3) may have a perovskite structure. A compound having a perovskite structure may be ferroelectric, and may be suitable for utilization in the hole-injection layer due to its high dipole moment.

When a ferroelectric material including a halogen element, e.g., a material having a dipole moment of greater than 50 debyes, is used in a hole-injection layer, the HOMO of the adjacent hole-transport layer is raised, such that holes are readily injected into the emission layer.

Figure 2A:
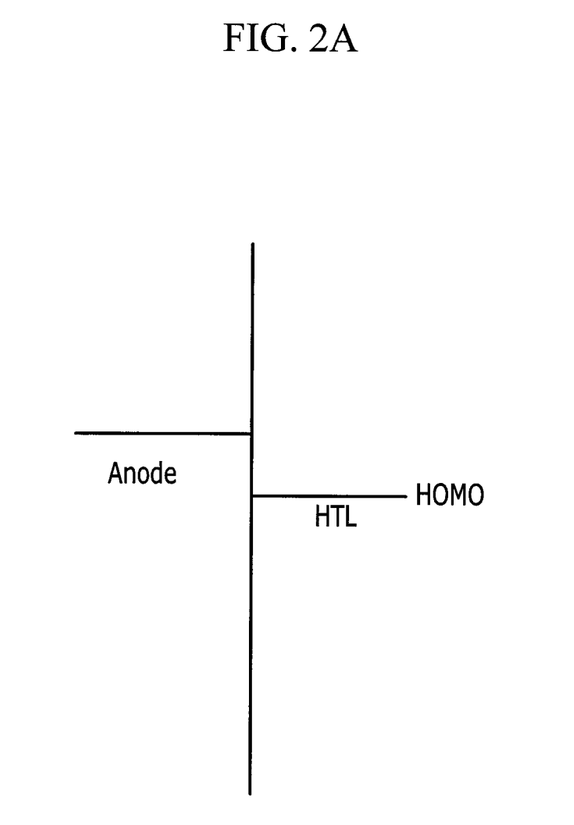
FIG. 2A and FIG. 2B illustrate the energy level change of an organic light emitting diode when a hole-injection layer according to an example embodiment of the present disclosure is applied.
Figure 2B:
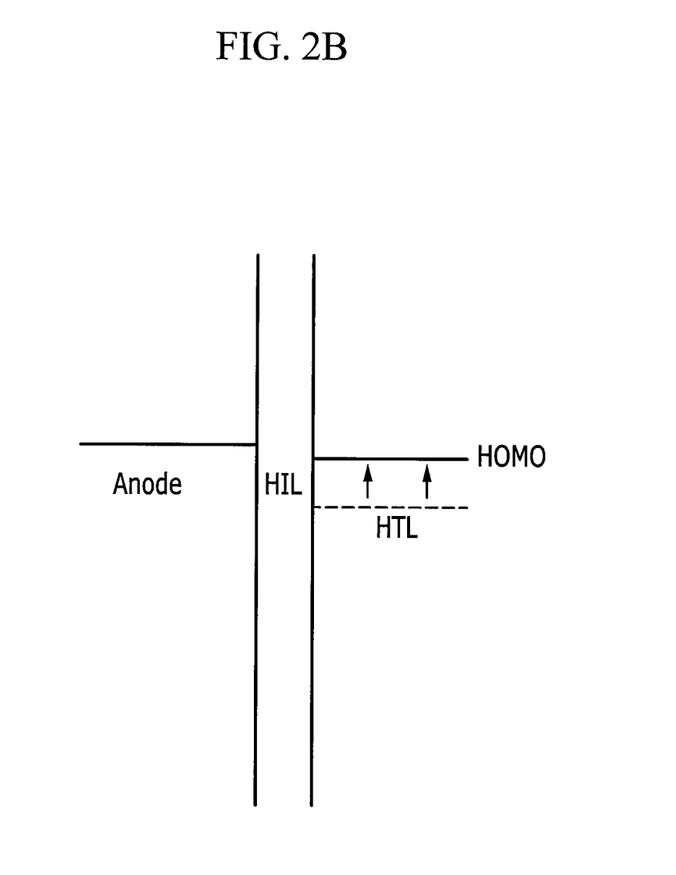

FIG. 2A and FIG. 2B illustrate the changes in energy levels of the organic light emitting diode when a hole-injection layer is applied according to an example embodiment of the present disclosure.

FIG. 2A illustrates the energy level of an organic light emitting diode before a hole-injection layer is applied according to the present example embodiment. Referring to FIG. 2A, there is an energy barrier between the anode and the hole-transport layer.

FIG. 2B illustrates the energy level of an organic light emitting diode after a hole-injection layer is applied according to the present example embodiment. As illustrated in FIG. 2B, the hole-injection layer increases the HOMO energy level of the hole-transport layer due to the presence of the material with a high dipole moment, thereby facilitating hole transportation.

As described above, when the hole-injection layer includes a ferroelectric ternary compound including a halogen element, the energy barrier between the HOMO of the hole-transport layer and the anode may be decreased or reduced.

The hole-injection layer may be manufactured by firstly heating a crucible containing two source materials for the ternary compound including a halogen element, and secondly heating the crucible such that the ternary compound is evaporatively deposited on an organic light emitting diode. This manufacturing method will be described later.

An electron-transport layer 70 may be between the cathode 20 and the emission layer 30. An electron-injection layer 50 may be positioned on the cathode 20, and the electron-transport layer 70 may be between the electron-injection layer 50 and the emission layer 30.

The electron-transport layer 70 may include at least one compound selected from the group consisting of a quinoline derivative, such as tris(8-hydroxyquinolinato)aluminum (Alq3), 3-(4-biphenyl)-4-phenyl-5-(4-tert-butylphenyl)-1,2,4-triazole (TAZ), (2-methyl-8-quninolinato)-4-phenylphenolate (BAlq), bis(10-hydroxybenzo[h]quinolinato)beryllium (Bebq2), and/or 4,7-diphenyl-1,10-phenanthroline (BPhen). In some embodiments, the electron-transport layer 70 may include a compound selected from the group and may also be doped with LiQ. In this case, the doping concentration may be about 50 wt %.

In one or more example embodiments, the electron-injection layer 50 may include a ternary compound including a halogen element.

The electron-injection layer 50 may be formed of a ternary compound represented by $A_mB_nC_z$. Herein, A may represent one element selected from a Group 1 element, a Group 2 element, a rare earth element, a transition metal, and a post-transition metal, and B may represent one element selected from a Group 1 element, a Group 2 element, a rare earth element, a transition metal, and a post-transition metal. C may represent a halogen element.

In one or more example embodiments, $A_mB_nC_z$ may represent a combination of a Group 1 element for A, a lanthanide element for B, and a halogen element for C.

m, n, and z may each independently be an integer from 1 to 5. m, n, and z may each be appropriately or suitably selected according to the selection of each A, B, and C element.

In one or more example embodiments, the electron-injection layer 50 may include at least one selected from $RbYbI_3$, $CsYbI_3$, $KYbI_3$, $NaYbI_3$, $LiYbI_3$, $RbSmI_3$, $CsSmI_3$, $KSmI_3$, $NaSmI_3$, $LiSmI_3$, $RbMgI_3$, $CsMgI_3$, $KMgI_3$, $NaMgI_3$, and $LiMgI_3$.

For example, according to the present example embodiment, the electron-injection layer 50 may be formed to have a ternary compound including a halogen element, and may be formed to have a ferroelectric material. In this case, the material applied to the electron-injection layer 50 may have a dipole moment of greater than 50 debyes.

In the present example embodiment, in the compound represented by $A_mB_nC_z$ in the electron-injection layer 50, m, n, and z may respectively be 1, 1, and 3. The compound represented by $ABC_3$ (m=1, n=1, and z=3) may have a perovskite structure. A compound having a perovskite structure may have ferroelectric properties, and may be suitable for utilization in the electron-injection layer of the present example embodiment, due to its high dipole moment.

When a ferroelectric material including a halogen element, e.g., a material having a dipole moment of greater than 50 debyes, is used in the electron-injection layer, the material in the electron-injection layer may lower the LUMO of the adjacent electron-transport layer such that electrons are readily injected into the emission layer.

Figure 3A:
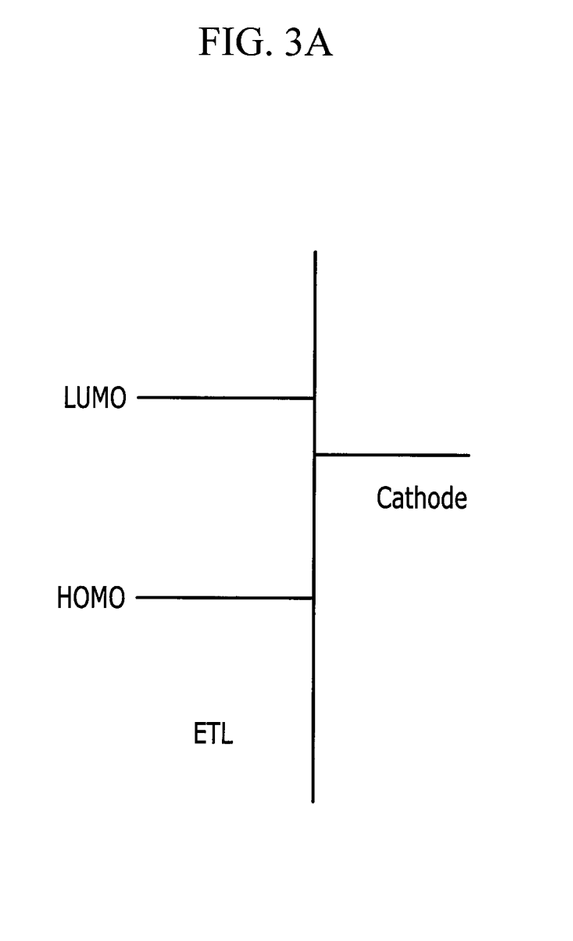
FIG. 3A and FIG. 3B illustrate the energy level change of an organic light emitting diode when an electron-injection layer according to an example embodiment of the present disclosure is applied.

FIG. 3A and FIG. 3B illustrate the changes in energy levels of the organic light emitting diode when an electron-injection layer is applied according to an example embodiment of the present disclosure. FIG. 3A illustrates the energy levels of an organic light emitting diode before an electron-injection layer is applied according to the present example embodiment. Referring to FIG. 3A, there is an energy barrier between the cathode and the LUMO of the electron-transport layer.

Figure 3B:
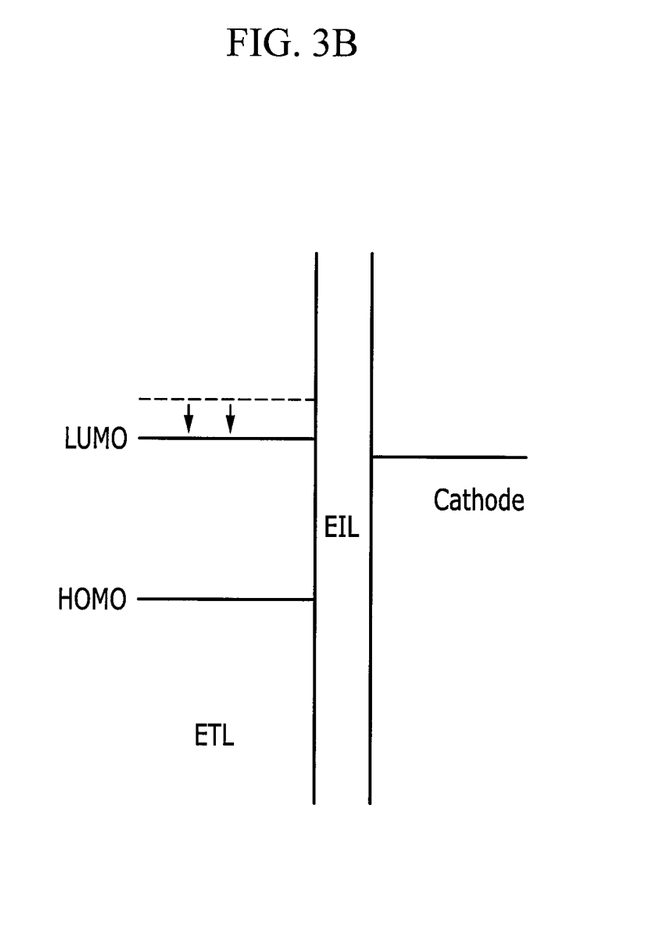

FIG. 3B illustrates the energy levels of the organic light emitting diode after an electron-injection layer is applied. As illustrated in FIG. 3B, the electron-injection layer lowers the LUMO level of the electron-transport layer due to the presence of the material having a high dipole moment, thereby facilitating electron transport.

In one or more embodiments, an electron-injection layer is formed of a ferroelectric material having a dipole moment of about 50 debyes. Therefore, the energy barrier between the LUMO level of the electron-transport layer and the cathode may be lowered.

A material used for the electron-injection layer, e.g., LiF, may have a dipole moment of about 6 debyes. A material such as a unary metal (Yb) or binary compound (LiF) with a dipole moment of that magnitude may contribute to lowering the LUMO energy level of the electron-transport layer, but not as much as in the present example embodiment. This is because the higher the dipole moment in a ferroelectric material, the larger the change in energy level of the adjacent electron-transport layer.

As described above, according to one or more example embodiments of the present disclosure, an organic light emitting diode may include a hole-injection layer or an electron-injection layer formed of a ternary compound including a halogen element. That is, a ferroelectric ternary compound including a halogen element may be used for the hole-injection layer or the electron-injection layer, and the efficiencies of hole and/or electron injection may be improved in comparison to an organic light emitting diode that does not include the ternary compound including a halogen element, so that the display device efficiency is improved.

Hereinabove, a configuration including both a hole-injection layer and an electron-injection layer, wherein the hole-injection layer and the electron-injection layer each include a ternary compound including a halogen element, will be described. However, other example embodiments of an organic light emitting diode may include one of an electron-injection layer and a hole-injection layer. Furthermore, other embodiments may include an electron-injection layer having a ternary compound including a halogen element and a hole-injection layer without a ternary compound including a halogen element. Likewise, some embodiments may include a hole-injection layer having a ternary compound including a halogen element and an electron-injection layer without a ternary compound including a halogen element. An electron-injection layer or a hole-injection layer may be referred to as an auxiliary layer, and configurations having the auxiliary layer positioned on one side of an emission layer and/or the opposite side of an emission layer both fall within the range of the present disclosure.

Table 1 lists measured driving voltage and efficiency characteristic values of an example organic light emitting diode having an electron-injection layer formed of $RbYbI_3$, as well as a comparative example having an electron-injection layer formed of a metal (Yb).

TABLE 1

| | | Comparative Example 1 (Yb) | Example 1 ($RbYbI_3$) |
|---|---|---|---|
| red | driving voltage | 5.5 | 4.5 |
| | R_x | 0.670 | 0.668 |
| | R_y | 0.329 | 0.331 |
| | R_efficiency | 50.4 | 61.3 |
| green | driving voltage | 4.2 | 3.7 |
| | G_x | 0.226 | 0.223 |
| | G_y | 0.709 | 0.726 |
| | G_efficiency | 82.8 | 105.3 |
| blue | driving voltage | 4.2 | 3.8 |
| | B_x | 0.145 | 0.143 |
| | B_y | 0.042 | 0.045 |
| | B_efficiency | 5.3 | 7.0 |
| | efficiency/B_y | 127 | 155.0 |
| white | W_efficiency | 41.1 | 50.4 |

As shown in Table 1, the organic light emitting diode according to Example 1 has a higher efficiency, even when operated at a lower driving voltage, than the organic light emitting diode according to Comparative Example 1.

For example, even though the driving voltage is reduced in Example 1, the red, green, and blue efficiencies are improved by more than about 20%.

Therefore, high organic light emitting diode efficiencies can be obtained at a reduced driving voltage.

Hereinafter, a method of manufacturing an organic light emitting diode according to an example embodiment of the present disclosure will be described with reference to FIG. 1.

First, an anode 10 is deposited on a substrate. The substrate may be any suitable substrate used in an organic light emitting diode. For example, a transparent plastic substrate or an organic substrate having excellent mechanical strength, thermal stability, transparency, surface smoothness, tractability, and/or waterproofness may be employed.

The anode 10, as described above, may be formed of a conductive oxide including indium tin oxide (ITO), indium zinc oxide (IZO), tin oxide ($SnO_2$), zinc oxide (ZnO), and/or a combination thereof, or of a metal thin film including aluminum (Al), silver (Ag), and/or magnesium (Mg). The anode 10 may be formed by a deposition method or a sputtering method.

Next, a hole-injection layer 40 is formed on the anode 10.

In this case, the hole-injection layer 40, as described above, may be formed to have a ternary compound including a halogen element.

For example, the hole-injection layer 40 may be formed of a ternary compound represented by $A_mB_nC_z$. Herein, A may represent one element selected from a Group 1 element, a Group 2 element, a rare earth element, a transition metal, and a post-transition metal, and B may represent one element selected from a Group 1 element, a Group 2 element, a rare earth element, a transition metal, and a post-transition metal. C may represent a halogen element.

Such a hole-injection layer may be formed by producing a ternary compound in one crucible, and then thermally evaporating the ternary compound in the crucible.

In other words, the ternary compound may be formed by mixing two source materials including elements of the ternary compound in a crucible, and then heating the crucible to form the ternary compound by thermal reaction.

For example, the hole-injection layer may be manufactured by mixing a first source material M and a second source material N in a crucible, heating to produce a ternary compound including a halogen element, and then heating the ternary compound for thermal evaporation and deposition.

The first source material M may be selected from a Group 1 element, a Group 2 element, a rare earth element, a transition metal, a halogen element, and/or a compound thereof.

The second source material N may be selected from a Group 1 element, a Group 2 element, a rare earth element, a transition metal, a post-transition metal, and/or a compound thereof.

Combinations of M+M, M+N, or M+M+N may be included in the crucible.

For example, the source materials for producing the ternary compound including a halogen element may be included in one crucible in an appropriate or suitable combination, without being limited thereto.

One crucible is required for this process, which is simpler than a manufacturing method requiring multiple crucibles. Furthermore, since the ternary compound is produced, evaporated, and deposited on the substrate in a single crucible, instead of being formed by evaporating raw materials in separate crucibles to react and deposit them on a substrate, the uniformity of the deposited compound may be improved or increased.

In order to form the hole-injection layer 40 having a ternary compound including a halogen element by this method, the evaporation temperature of the ternary compound including the halogen element should be lower (e.g., substantially lower) than the evaporation temperatures of the first material and the second material.

In one example embodiment, RbI and Yb are mixed in one crucible, $RbYbI_3$ is produced by heating, and then $RbYbI_3$ evaporates when the crucible is heated for deposition, because the evaporation temperature of $RbYbI_3$ is lower than those of the source materials.

The evaporation temperature of RbI is 646.8° C., and the evaporation temperature of Yb is 824° C. However, the evaporation temperature of the manufactured $RbYbI_3$ is 568° C., which is lower than the evaporation temperatures of the individual compounds, so the $RbYbI_3$ evaporates first.

Therefore, a uniform (e.g., substantially uniform) RbYbI$_3$ hole-injection layer may be deposited on the substrate.

Next, a hole-transport layer 60 is formed on the hole-injection layer 40.

The hole-transport layer 60 may be made of any suitable hole-transport material, as described above.

A hole-transport layer may be formed by any suitable method generally available in the art, such as a vacuum deposition method, a spin coating method, a casting method, a Langmuir-Blodgett (LB) method, and/or the like. When the hole-transport layer is formed by a vacuum deposition method and/or a spin coating method, the hole-transport layer may be formed using appropriate or suitable conditions; such as, for example, a deposition temperature in a range of about 50 to about 500° C., a vacuum pressure in a range of about $10^{-8}$ to about $10^{-3}$ torr, a deposition speed in a range of about 0.01 to about 100 Å/s, and a layer thickness in a range of about 10 Å to about 5 µm, although the deposition and coating conditions may vary according to the compound.

Next, the emission layer 30 is formed on the hole-transport layer 60. The emission layer 30 may be formed of any suitable emission layer material, as described above.

The emission layer may be formed by a vacuum deposition method, a spin coating method, a casting method, an LB method, and/or the like.

The thickness of the emission layer may be in a range of about 10 nm to about 500 nm, or of about 50 nm to about 120 nm. In some embodiments, the blue emission layer may have a thickness of about 70 nm. In the case of the emission layer having a thickness less than 10 nm, the leakage current would be increased, so efficiency would decrease and the lifespan would be shortened, and in the case of the emission layer having a thickness exceeding 500 nm, a driving voltage increment would be undesirably or unsuitably increased.

Next, the electron-transport layer 70 is formed on the emission layer 30. The material of the electron-transport layer 70 may include any suitable material for an electron-transport layer, as described above.

The electron-transport layer 70 may be formed by any suitable method such as a vacuum deposition method, a spin coating method, a casting method, and/or the like. In the case of a vacuum deposition method and a spin coating method, the formation conditions may vary according to the compound that is employed.

The electron-transport layer 70 may have a thickness in a range of about 100 Å to about 1000 Å, and in some embodiments of about 100 Å to about 500 Å. When the thickness of the electron-transport layer 70 is within the aforementioned range, excellent electron transport characteristics may be obtained without a substantial increase in driving voltage.

Next, the electron-injection layer 50 is formed on the electron-transport layer 70. In this case, the electron-injection layer 50 may be formed of a ternary compound including a halogen element as described above.

For example, the electron-injection layer 50 may be formed of a ternary compound represented by $A_mB_nC_z$. Herein, A may represent one element selected from a Group 1 element, a Group 2 element, a rare earth element, a transition metal, and a post-transition metal, and B may represent one element selected from a Group 1 element, a Group 2 element, a rare earth element, a transition metal, and a post-transition metal. C may represent a halogen element.

The method used to form this electron-injection layer may be the same as the above-described method used to form the hole-injection layer. For example, an electron-injection layer may be formed by mixing the first source material (a Group 1 element, a Group 2 element, a rare earth element, a transition metal, a halogen element, or a compound thereof) and the second source material (a Group 1 element, a Group 2 element, a rare earth element, a transition metal, a post-transition metal, or a compound thereof) in one crucible, heating the crucible to produce a ternary compound including a halogen element, and then thermally evaporating the materials in the crucible. Detailed descriptions of the same elements will not be provided.

Next, a cathode is formed on the electron-injection layer 50 by a vacuum deposition method, a sputtering method, or the like using a cathode forming metal. Herein, as described above, the cathode forming metal may be selected from a metal having a low work function, an alloy, an electrically conductive compound, and a mixture thereof. Non-limiting examples of the cathode forming metal may include lithium (Li), magnesium (Mg), aluminum (Al), aluminum-lithium (Al—Li), calcium (Ca), magnesium-indium (Mg—In), magnesium-silver (Mg—Ag), and/or the like. Further, for obtaining a surface light emitting device, the cathode may be formed of a transparent material such as ITO or IZO.

Figure 5:
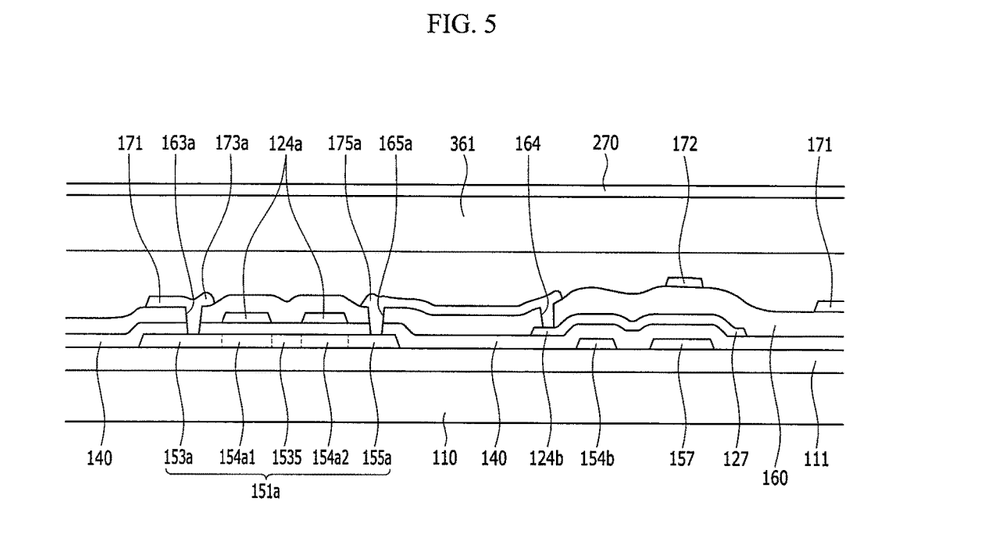
FIG. 5 is a cross-sectional view of an organic light emitting diode display of FIG. 4 taken along the line V-V.
Figure 6:
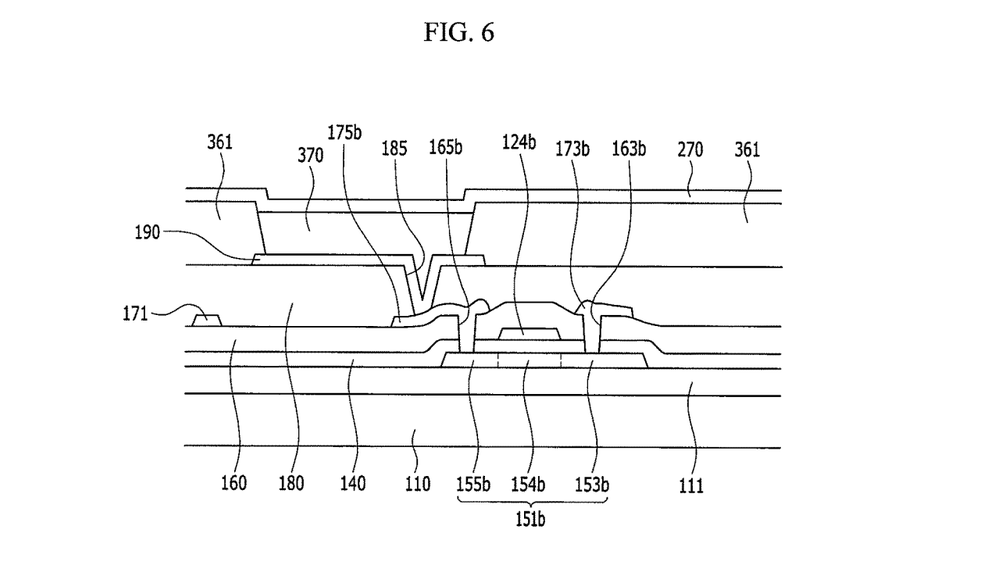
FIG. 6 is a cross-sectional view of an organic light emitting diode display of FIG. 4 taken along the line VI-VI.

Hereinafter, an organic light emitting diode display having an organic light emitting diode according to an example embodiment of the present disclosure will be described in detail with reference to FIG. 4 to FIG. 6.

Figure 4:
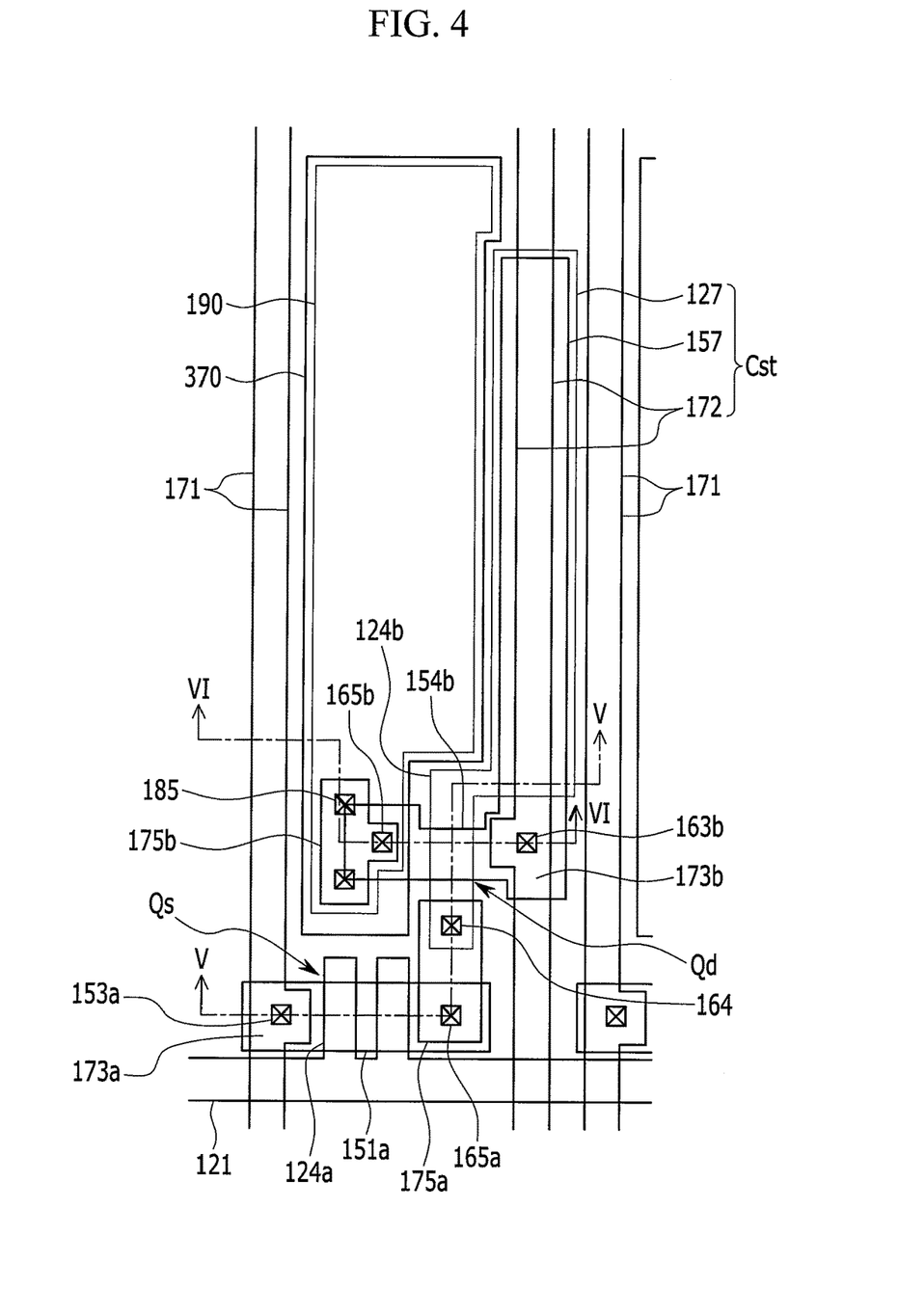
FIG. 4 is a layout view of an organic light emitting diode display according to an example embodiment of the present disclosure.

FIG. 4 is a layout view of an organic light emitting diode display according to an example embodiment of the present disclosure. FIG. 5 is a cross-sectional view of the organic light emitting diode display of FIG. 4 taken along the line V-V. FIG. 6 is a cross-sectional view of the organic light emitting diode display of FIG. 4 taken along the line VI-VI.

A blocking layer 111 made of a silicon oxide or a silicon nitride is formed on a substrate 110 made of a transparent glass and/or the like. The blocking layer 111 may have a dual-layer structure.

A plurality of pairs of first and second semiconductor islands 151*a* and 151*b* made of polysilicon and/or the like are formed on the blocking layer 111. Each of the semiconductor islands 151*a* and 151*b* includes a plurality of extrinsic regions containing an n-type or p-type conductive impurity, and at least one intrinsic region hardly containing any conductive impurities.

In the first semiconductor 151*a*, the extrinsic region includes first source/drain regions 153*a* and 155*a* and an intermediate region 153S, and the first source/drain regions 153*a* and 155*a* and the intermediate region 153S are doped with an n-type impurity and are separated from one another. The intrinsic region includes a pair of first channel regions 154*a*1 and 154*a*2 disposed between the extrinsic regions 153*a*, 153S, and 155*a*.

In the second semiconductor 151*b*, the extrinsic region includes second source/drain regions 153*b* and 155*b* that are doped with a p-type impurity and are separated from each other. The intrinsic region includes a second channel region 154*b* interposed between the second source/drain regions 153*b* and 155*b*, and a storage region 157 extending upward from the second source/drain regions 153*b* and 155*b*.

The extrinsic region may further include a lightly doped region interposed between the channel regions 154*a*1, 154*a*2, and 154*b* and the source/drain regions 153*a*, 155*a*, 153*b*, and 155*b*. Such a lightly doped region may be substituted with an offset region containing substantially few impurities.

In some embodiments, the extrinsic regions 153a and 155a of the first semiconductor 151a may be doped with a p-type impurity, and the extrinsic regions 153b and 155b of the second semiconductor 151b may be doped with an n-type impurity. A p-type conductive impurity may include boron (B), gallium (Ga), and/or the like, and an n-type conductive impurity may include phosphorous (P), arsenic (As), and/or the like.

A gate insulating layer 140 made of a silicon oxide or a silicon nitride is formed on the semiconductors 151a and 151b and the blocking layer 111.

A plurality of gate lines 121 including a first control electrode 124a and a plurality of gate conductors including a plurality of second control electrodes 124b are formed on the insulating layer 140.

Each gate line 121 transmits a gate signal and extends in a substantially horizontal direction. The first control electrode 124a extends upward from the gate line 121 and intersects the first semiconductor 151a to overlap the first channel regions 154a1 and 154a2. Each gate line 121 may include an end portion having a large area for contacting another layer or an external driving circuit. In the case that a gate driving circuit for generating the gate signal is integrated on the substrate 110, the gate line 121 may extend to make a direct connection to the gate driving circuit.

The second control electrode 124b is separated from the gate line 121 and overlaps the second channel region 154b of the second semiconductor 151b. The second control electrode 124b extends to form a storage electrode 127, and the storage electrode 127 overlaps the storage region 157 of the second semiconductor 151b.

The gate conductors 121 and 124b may be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), and/or the like. However the gate conductors 121 and 124b may have a multilayer structure including two conductive layers having different physical properties. One of the two conductive layers may be made of a low resistivity metal, e.g., an aluminum-based metal, a silver-based metal, a copper-based metal, and/or the like, for reducing the signal delay or voltage drop. The other conductive layer may be made of another material, for example, a material having excellent physical, chemical, and electrical contact characteristics with indium tin oxide (ITO) and indium zinc oxide (IZO), such as molybdenum, chromium, titanium, tantalum, alloys thereof, and the like. For example, a combination of the conductive layers may include a chromium lower layer and an aluminum alloy upper layer, and an aluminum alloy lower layer and a molybdenum alloy upper layer. However, the gate conductors 121 and 124b may be made of various other metals or conductors.

Lateral sides of the gate conductors 121 and 124b are inclined to a surface of the substrate 110, and the inclination angle thereof may be in a range of about 30° to about 80°.

An interlayer insulating film 160 is formed on the gate conductors 121 and 124b. The interlayer insulating film 160 is made of an inorganic insulator such as a silicon nitride and a silicon oxide, an organic insulator, or a low dielectric constant insulator. The dielectric constant of the low dielectric constant insulator may be equal to or less than about 4.0, and examples of the low dielectric constant insulator may include a-Si:C:O and a-Si:O:F formed by plasma enhanced chemical vapor deposition (PECVD). The interlayer insulating film 160 may be made of an organic insulator having photosensitivity, and the surface of the interlayer insulating film 160 may be flat.

The interlayer insulating film 160 has a plurality of contact holes 164 exposing the second control electrode 124b. Further, the interlayer insulating film 160 and the gate insulating layer 140 have a plurality of contact holes 163a, 163b, 165a, and 165b exposing the source/drain regions 153a, 153b, 155a, and 155b.

A plurality of data conductors including a data line 171, a driving voltage line 172, and first and second output electrodes 175a and 175b are formed on the interlayer insulating film 160.

Each data line 171 transfers a data signal and extends in a substantially vertical direction to cross the gate line 121. Each data line 171 includes a plurality of first input electrodes 173a connected to the first source/drain region 153a through the contact hole 163a, and may include an end portion having a large area for contacting another layer or an external driving circuit. In the case that a data driving circuit generating a data signal is integrated on the substrate 110, the data line 171 may extend to make a direct connection to the data driving circuit.

Each driving voltage line 172 transmits a driving voltage, and extends in a substantially vertical direction crossing the gate line 121. Each driving voltage line 172 includes a plurality of second input electrodes 173b connected (e.g., coupled) to the second source/drain region 153b through the contact hole 163b. The driving voltage line 172 overlaps the storage electrode 127, and they may be connected to each other.

The first output electrode 175a is separated from the data line 171 and the driving voltage line 172. The first output electrode 175a is connected to the first source/drain region 155a through the contact hole 165a and to the second control electrode 124b through the contact hole 164.

The second output electrode 175b is separated from the data line 171, the driving voltage line 172, and the first output electrode 175a, and the second output electrode 175b is connected to the second source/drain region 155b through the contact hole 165b.

The data conductors 171, 172, 175a, and 175b may be made of a refractory metal such as molybdenum, chromium, tantalum, titanium, and/or the like, or an alloy thereof, and may have a multilayer structure including a conductive layer made of a refractory metal and a conductive layer made of a low resistance material. An example of the multilayered structure may include a double layer including a chromium or molybdenum (alloy) lower layer and an aluminum (alloy) upper layer, and a triple layer including a molybdenum (alloy) lower layer, an aluminum (alloy) intermediate layer, and a molybdenum (alloy) upper layer. However, the data conductors 171, 172, 175a, and 175b may be made of various other metals and conductors.

Like the gate conductors 121 and 121b, the lateral sides of the data conductors 171, 172, 175a, and 175b are inclined to the surface of the substrate at an angle of about 30° to about 80°.

A passivation layer 180 is formed on the data conductors 171, 172, 175a, and 175b. The passivation layer 180 may be made of an inorganic material, an organic material, or a low dielectric constant insulating material.

The passivation layer 180 has a plurality of contact holes 185 exposing the second output electrode 175b. Further, the passivation layer 180 may have a plurality of contact holes exposing an end portion of the data line 171, and the passivation layer 180 and the interlayer insulating film 160 may have a plurality of contact holes exposing an end portion of the gate line 121.

A plurality of pixel electrodes 190 are formed on the passivation layer 180. The pixel electrode 190 is physically and electrically connected to the second output electrode 175b through the contact hole 185, and the pixel electrode 190 may be made of a transparent conductive material such as ITO and IZO, and/or a reflective metal such as aluminum, silver, and alloys thereof.

A plurality of contact assistants or a connecting member may be formed on the passivation layer 180 and may be connected to an exposed end portion of the gate line 121 and the data line 171.

A partition 361 is formed on the passivation layer 180. The partition 361 surrounds an edge of the pixel electrode 190 like a bank for defining an opening, and the partition 361 may be made of an organic insulator or an inorganic insulator. The partition 361 may be made of a photoresist including a black pigment. In this case, the partition 361 may serve as a light blocking member, and the formation process of the partition 361 may be streamlined.

A light emitting diode layer 370 is formed on the pixel electrode 190, and a common electrode 270 is formed on the light emitting diode layer 370. As such, an organic light emitting diode including the pixel electrode 190, the light-emitting diode layer 370, and the common electrode 270 is formed.

Descriptions of the organic light emitting diode are the same as those provided above. That is, the organic light emitting diode may have a structure of anode/hole-injection layer/hole-transport layer/emission layer/electron-transport layer/electron-injection layer/cathode.

In this case, the pixel electrode 190 serves as an anode that is a hole injection electrode, and the common electrode 270 serves as a cathode that is an electron injection electrode. However, embodiments of the present disclosure are not limited thereto, and depending on the driving method of the organic light emitting diode display, the pixel electrode 190 may serve as a cathode and the common electrode 270 may serve as an anode. In this embodiment, a hole and an electron, respectively, are injected from the pixel electrode 190 and the common electrode 270 into the light emitting diode layer 370, and an exciton obtained by recombination of the injected hole and the injected electron emits light when the exciton changes from an excited state to the ground state.

The common electrode 270 is formed on the light-emitting diode layer 370. The common electrode 270 is supplied with a common voltage and may be made of a reflective metal including calcium (Ca), barium (Ba), magnesium (Mg), or aluminum (Al), and/or a transparent conductive material such as ITO or IZO.

In the organic light emitting diode display according to the present example embodiment, descriptions of the hole-injection layer/hole-transport layer/emission layer/electron-transport layer/electron-injection layer forming an organic light emitting diode are the same as those provided above.

For example, the hole-injection layer or the electron-injection layer may be formed to have a ternary compound including a halogen element. In this case, the material applied to the electron-injection layer or the hole-injection layer may include a ferroelectric material having a dipole moment of greater than 50 debyes.

The hole-injection layer or the electron-injection layer may be formed of a ternary compound represented by $A_mB_nC_z$. Herein, A may represent one element selected from a Group 1 element, a Group 2 element, a rare earth element, a transition metal, or a post-transition metal, and B may represent one element selected from a Group 1 element, a Group 2 element, a rare earth element, a transition metal, or a post-transition metal. C may represent a halogen element.

In the present example embodiment, $A_mB_nC_z$ may represent a combination of a Group 1 element for A, a lanthanide element for B, and a halogen element for C.

m, n, and z may each independently be an integer from 1 to 5. m, n, and z may each be appropriately or suitably selected according to the selection of each A, B, and C element.

The ternary compound including a halogen element may be at least one selected from the group consisting of $RbYbI_3$, $CsYbI_3$, $KYbI_3$, $NaYbI_3$, $LiYbI_3$, $RbSmI_3$, $CsSmI_3$, $KSmI_3$, $NaSmI_3$, $LiSmI_3$, $RbMgI_3$, $CsMgI_3$, $KMgI_3$, $NaMgI_3$, and $LiMgI_3$.

In the above-described organic light emitting diode display, the first semiconductor 151a, the first control electrode 124a connected to the gate line 121, the first input electrode 173a connected to the data line 171, and the first output electrode 175a together form a switching thin film transistor (TFT) Qs, and a channel of the switching TFT Qs is formed in the channel regions 154a1 and 154a2 of the first semiconductor 151a. The second semiconductor 151b, the second control electrode 124b connected to the first output electrode 175a, the second input electrode 173b connected to the driving voltage line 172, and the second output electrode 175b connected to the pixel electrode 190 together form a driving TFT Qd, and a channel of the driving TFT Qd is formed in the channel region 154b of the second semiconductor 151b. The pixel electrode 190, the light-emitting diode layer 370, and the common electrode 270 form an organic light emitting diode, wherein the pixel electrode 190 may serve as an anode and the common electrode 270 may serve as a cathode, or alternatively, the pixel electrode 190 may serve as a cathode and the common electrode 270 may serve as an anode. The storage electrode 127, the driving voltage line 172, and the storage region 157 that are overlapping with one another form a storage capacitor Cst.

The switching thin film transistor Qs transmits a data signal via the data line 171 in response to a gate signal of the gate line 121. When the driving thin film transistor Qd receives a data signal, the driving thin film transistor Qd passes a current having a magnitude dependent on the voltage difference between the second control electrode 124b and the second input electrode 173b. The voltage difference between the second control electrode 124b and the second input electrode 173b is stored in the storage capacitor Cst, and is maintained after the switching thin film transistor Qs is turned off. The organic light emitting diode displays an image by emitting light having various intensities, depending on the magnitude of the current flowing from the driving thin film transistor Qd.

The above-described structure of an organic light emitting diode display is an example, and it should be apparent to one of ordinary skill in the art that the organic light emitting diode according to one or more example embodiments of the present disclosure can be applied to an organic light emitting diode display having a different structure.

As used herein, expressions such as "at least one of" and "one of", when preceding a list of elements, modify the entire list of elements and do not modify the individual elements of the list. Further, the use of "may" when describing embodiments of the present invention refers to "one or more embodiments of the present invention".

In addition, as used herein, the terms "use", "using", and "used" may be considered synonymous with the terms "utilize", "utilizing", and "utilized", respectively.

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While this disclosure has been described in connection with what is presently considered to be practical example embodiments, it is to be understood that the disclosure is not limited to the disclosed embodiments but, on the contrary, is intended to cover various modifications and equivalent arrangements included within the spirit and scope of the appended claims and equivalents thereof.

DESCRIPTION OF SOME OF THE SYMBOLS

| | |
|---|---|
| 10: anode | 20: cathode |
| 30: emission layer | 40: hole-injection layer |
| 50: electron-injection layer | 60: hole-transport layer |
| 70: electron-transport layer | |
| 110: substrate | 121: gate line |
| 140: gate insulating layer | 151: semiconductor |
| 171: data line | 180: passivation layer |
| 190: pixel electrode | 270: common electrode |

What is claimed is:

1. An organic light emitting diode comprising:
   an anode and a cathode facing each other;
   an emission layer between the anode and the cathode;
   a hole-transport layer between the anode and the emission layer;
   an electron-transport layer between the cathode and the emission layer; and
   an auxiliary layer between at least one selected from a pair of the anode and the hole-transport layer and a pair of the cathode and the electron-transport layer,
   wherein the auxiliary layer comprises a hole-injection layer and/or an electron-injection layer, and
   wherein the hole-injection layer and/or the electron-injection layer comprises a ternary compound comprising at least one selected from $RbYbI_3$, $CsYbI_3$, $KYbI_3$, $NaYbI_3$, $LiYbI_3$, $RbSmI_3$, $CsSmI_3$, $KSmI_3$, $NaSmI_3$, $LiSmI_3$, $RbMgI_3$, $CsMgI_3$, $KMgI_3$, $NaMgI_3$, and $LiMgI_3$.

2. The organic light emitting diode of claim 1, wherein the auxiliary layer comprises the hole-injection layer, and the hole-injection layer is between the anode and the hole-transport layer.

3. The organic light emitting diode of claim 1, wherein the auxiliary layer comprises the electron-injection layer, and the electron-injection layer is between the cathode and the electron-transport layer.

4. The organic light emitting diode of claim 1, wherein the auxiliary layer comprises the hole-injection layer and the electron-injection layer, the hole-injection layer is between the anode and the hole-transport layer, and the electron-injection layer is between the cathode and the electron-transport layer.

5. The organic light emitting diode of claim 1, wherein the ternary compound has a perovskite structure.

6. The organic light emitting diode of claim 1, wherein the auxiliary layer comprises a material having a dipole moment of greater than 50 debyes.

7. A method of manufacturing an organic light emitting diode, comprising:
   forming an anode on a substrate;
   forming an emission layer on the anode;
   forming an electron-transport layer on the emission layer;
   forming an electron-injection layer on the electron-transport layer; and
   forming a cathode on the electron-injection layer,
   wherein the electron-injection layer comprises a ternary compound comprising at least one selected from $RbYbI_3$, $CsYbI_3$, $KYbI_3$, $NaYbI_3$, $LiYbI_3$, $RbSmI_3$, $CsSmI_3$, $KSmI_3$, $NaSmI_3$, $LiSmI_3$, $RbMgI_3$, $CsMgI_3$, $KMgI_3$, $NaMgI_3$, and $LiMgI_3$, and
   the forming of the electron-injection layer comprises:
   mixing source materials for the ternary compound in one crucible;
   producing the ternary compound by heating the crucible; and
   evaporating and depositing the ternary compound by heating the crucible.

8. The manufacturing method of claim 7, wherein, in the mixing of the source materials for the ternary compound in one crucible:
   the source materials mixed in the crucible comprise a combination of a first source material and a second source material, a combination of a first source material and another first source material, or a combination of a first source material, another first source material, and a second source material;
   wherein the first source material comprises at least one selected from a Group 1 element, a Group 2 element, a rare earth element, a transition metal, a halogen element, and a compound thereof; and
   the second source material comprises at least one selected from a Group 1 element, a Group 2 element, a rare earth element, a transition metal, a post-transition metal, and a compound thereof.

9. The manufacturing method of claim 8, wherein the evaporation temperature of the ternary compound is lower than the evaporation temperature of the first source material and the second source material.

10. The manufacturing method of claim 7, wherein between steps of forming the anode on the substrate, and forming the emission layer on the anode,
   the method further comprises forming a hole-injection layer on the anode,
   wherein the hole-injection layer comprises the ternary compound, and
   the forming of the hole-injection layer comprises:
   mixing source materials for the ternary compound in one crucible;

producing the ternary compound by heating the crucible; and evaporating and depositing the ternary compound.

11. An organic light emitting diode display comprising:
a substrate;
a thin film transistor on the substrate; and
an organic light emitting element connected to the thin film transistor,
wherein the organic light emitting element includes:
an anode and a cathode facing each other;
an emission layer between the anode and the cathode;
a hole-transport layer between the anode and the emission layer;
an electron-transport layer between the cathode and the emission layer; and
an auxiliary layer between the anode and the hole-transport layer, or between the cathode and the electron-transport layer,
wherein the auxiliary layer comprises a hole-injection layer and/or an electron-injection layer, and
wherein the hole-injection layer and/or the electron-injection layer comprises a ternary compound comprising at least one selected from $RbYbI_3$, $CsYbI_3$, $KYbI_3$, $NaYbI_3$, $LiYbI_3$, $RbSmI_3$, $CsSmI_3$, $KSmI_3$, $NaSmI_3$, $LiSmI_3$, $RbMgI_3$, $CsMgI_3$, $KMgI_3$, $NaMgI_3$, and $LiMgI_3$.

12. The organic light emitting diode display of claim 11, wherein the auxiliary layer comprises the hole-injection layer, and the hole-injection layer is between the anode and the hole-transport layer.

13. The organic light emitting diode display of claim 11, wherein the auxiliary layer comprises the electron-injection layer, and the electron-injection layer is between the cathode and the electron-transport layer.

14. The organic light emitting diode display of claim 11, wherein the auxiliary layer comprises the hole-injection layer and the electron-injection layer, the hole-injection layer is between the anode and the hole-transport layer, and the electron-injection layer is between the cathode and the electron-transport layer.

15. The organic light emitting diode display of claim 11, wherein the auxiliary layer comprises a material having a dipole moment of greater than 50 debyes.

* * * * *